United States Patent [19]

Smith

[11] Patent Number: 4,638,405

[45] Date of Patent: Jan. 20, 1987

[54] INJECTOR/EJECTOR DEVICE FOR CIRCUIT BOARD

[75] Inventor: Kenneth R. Smith, Southington, Conn.

[73] Assignee: Bicc-Vero Electronics, Inc., Trumbull, Conn.

[21] Appl. No.: 809,473

[22] Filed: Dec. 16, 1985

[51] Int. Cl.$^4$ .................. H01R 13/62; H05K 5/02
[52] U.S. Cl. .................. 361/399; 339/45 M; 339/75 M; 339/75 MP; 361/413; 361/415
[58] Field of Search .................. 361/339, 413, 415; 339/45 M, 75 M, 75 MP

[56] References Cited

U.S. PATENT DOCUMENTS 4,301,494 11/1981 Jordan .................. 361/415
4,345,809 8/1982 Sugden .................. 339/45 M
4,497,528 2/1985 Murtland .................. 339/75 M X

FOREIGN PATENT DOCUMENTS 0119951 9/1984 European Pat. Off. .......... 339/75 M

Primary Examiner—Arthur T. Grimley
Assistant Examiner—Jane K. Lau
Attorney, Agent, or Firm—Anthony P. DeLio

[57] ABSTRACT

A device for aiding in the injection and removal of printed circuit boards from card cages. The device comprises in combination, anchor means for affixing the device both to the printed circuit board and to the cage and lever means adapted to develop linear inward and outward directed forces with a single degree of freedom so that no rotational bending forces are developed on the pins of a plug on the board when they are injected into or ejected from the holes of a mating socket in the cage.

14 Claims, 7 Drawing Figures

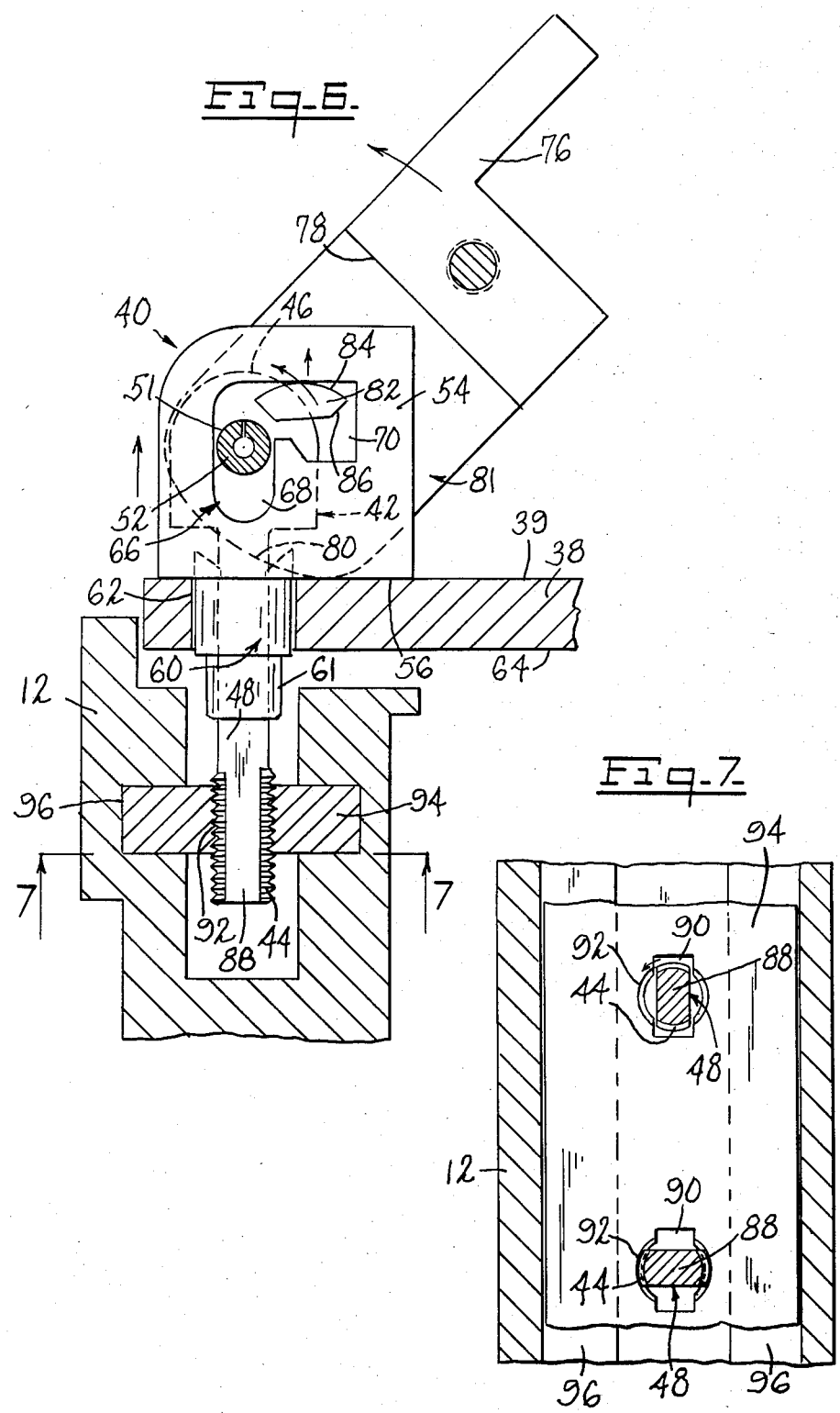

INJECTOR/EJECTOR DEVICE FOR CIRCUIT BOARD

This invention relates to an injection/ejection device for printed circuit boards (PCB) and more particulalry to a device for use in aiding the insertion and removal of a PCB with mating sockets mounted on a card cage.

BACKGROUND OF THE INVENTION

Typically, in a small cabinet or card cage housing for PCB's, there is a frame containing a group of top and bottom guide channels within which individual circuit boards are slid into and out of the cage. Mounted on a rear edge of each board is at least one connector plug incorporating a number of pins which mate with corresponding holes in a connector socket in a connector module mounted at the rear end of each of said channels within the cabinet. Electrical connection between circuit board components, jumper wires, etc., is obtained by the mating of the plug with its associated connector socket.

Since many pin to hole connections must be made simultaneously with an insertion of a PCB, each engagement must be sufficiently resilient to allow for proper insertion even with pins that are slightly misaligned or bent or both. Consequently, the force necessary to insert or to remove a particular PCB can easily range from 9 to 26 lbs per connector. In the ensuing disclosure, the terms "insertion" or "injection" and "removal" or "ejection" of a PCB refer to a mounting operation which results in the connector plug and socket modules being mated to unmated. The terms do not denote additional unfettered sliding movements of the PCB's within the guide channels.

In many PCB installations, the front end of the board carries a face plate, which acts to close off the particular space in front of the frame location occupied by the PCB. Once all the boards are inserted, the face plates combine to present a substantially unbroken flat surface which acts to keep dust and other contamination away from the interior of the cabinet. However, with close packing of PCB's in the frame, when and if it is necessary to remove a particular PCB, there is often considerable difficulty in getting a good grip on the face plate in order to accomplish said withdrawal. This is particularly true for the initial ejection movement when the rear connector plug must be disengaged from its associated socket.

To assist in said injection and ejection, the front edge of the PCB may support one or more lever devices at the top and bottom edges thereof to generate the forces necessary for such movement. The prior art shows a number of such devices for performing this function such as those which are depicted in the following U.S. patents:

U.S. Pat. No. 4,313,150, dated July 26, 1982, to P. Chu; U.S. Pat. No. 4,233,646, dated Nov. 11, 1980, to E. C. Leung et al.; U.S. Pat. No. 4,197,572, dated Apr. 8, 1980, to M. Aimar; and U.S. Pat. No. 4,064,551, dated Sept. 20, 1977, to R. Lightfoot and attention is directed to them.

Many of these devices to generate the forces needed, are primarily designed to hook onto the front frame members of the cabinet and rotate around them. In so doing, the linear insertion forces also tend to develop small rotational moments at the front edge of the board. Such rotational moments cause the plug at the opposite end of the board to cock or tilt slightly which, if not causing the pins to bend, will tend to increase the magnitude of the linear forces needed to accomplish insertion and removal.

The present invention covers an apparatus for effectively injecting and ejecting a PCB from a rear connector socket so that said PCB can be readily inserted into and withdrawn from the frame without the deficiencies of the prior art as noted above. As disclosed herein the device provides for the generation of a direct linear force for such injection and ejection without generating undesirable rotational forces. It is therefore an advantage of the present invention that the forces generated to perform said injection and ejection are both linear and coplanar with the axis of the PCB with no rotational forces being developed at the pin/socket interface.

OBJECTS OF THE INVENTION

It is an object of the present invention to provide a new and improved device for the injection and ejection of printed circuit boards in card cages without the generation of specious and deletrious forces.

Still other objects and advantages of the present invention will in part be obvious and in part be apparent from the drawings and specification.

SUMMARY OF THE INVENTION

The invention accordingly comprises the features of construction, combination of elements and arrangement of parts as exemplified in the construction set forth in the specification and drawings and the scope of the invention is as indicated in the appended claims.

The above objects advantages and features are met by an injection/ejection device to aid in the entry and removal of a printed circuit board into a card cage. As disclosed herein, said device has, in combination, a lever arm having a bifurcated portion at one end comprising a pair of arms each having a camlike arcuate surface at one corner thereof which are rotatably attached to the ends of a pivot pin in an aspect such that, when the device is fully assembled and mounted onto a PCB face plate, the arcuate surface will, upon a first clockwise rotation of the lever arm around the pivot pin, eccentrically bear upon the outer surface of the face plate to generate an inwardly directed linear force having only a single degree of freedom so that there is no rotational force developed in the pins of a plug mounted on the rear edge of the PCB. Within the confines of the space defined by the lever arms is an anchor pin, which is fixedly attached, at its outer end, to said pivot pin more or less in the center thereof in an aspect which is parallel to and substantially in the plane of the PCB and further having mounting means at its inner end which, after a preliminary insertion of the PCB into a card cage causes it to be firmly attached to the structure thereof.

Also located within the space defined by the lever arm are a pair of brackets slidably mounted onto said pivot pin, one on either side of said anchor pin. Each bracket comprises means for holding the device onto the PCB face plate. Slidable mounting is accomplished within a bracket aperture having an elongated first portion which is parallel to the anchor pin and through which the pivot pin passes in conjunction with a second aperture portion positioned to receive a spur mounted on the inner side of an adjacent lever arm. Upon a second counter clockwise rotation of said lever arm, these spurs will eccentrically bear upon an upper bearing surface of said second portion to cause the brackets to slide outwardly along the anchor pin said sliding motion being confined by said first aperture portion to cause the generation of a linear outwardly directed force also having only a single degree of freedom so that no rotational force will be applied to the plug pin. Upon attachment of the device to the PCB face plate and upon the generation of the aforesaid linear forces, the bracket and its attached PCB will slide inward or outward along the length of the anchor pin to cause the mating or demating of the plug and socket.

BRIEF DESCRIPTION OF THE DRAWINGS

The present invention will be described in greater detail with reference to the accompanying drawings, wherein like parts in each of the several figures are identified by the same reference number and wherein:

FIG. 6 is a cross sectional view along line 6—6 of FIG. 3;

FIG. 7 is an enlarged cross sectional view taken along line 7—7 of FIG. 6.

DETAILED DESCRIPTION OF THE INVENTION

Figure 1:
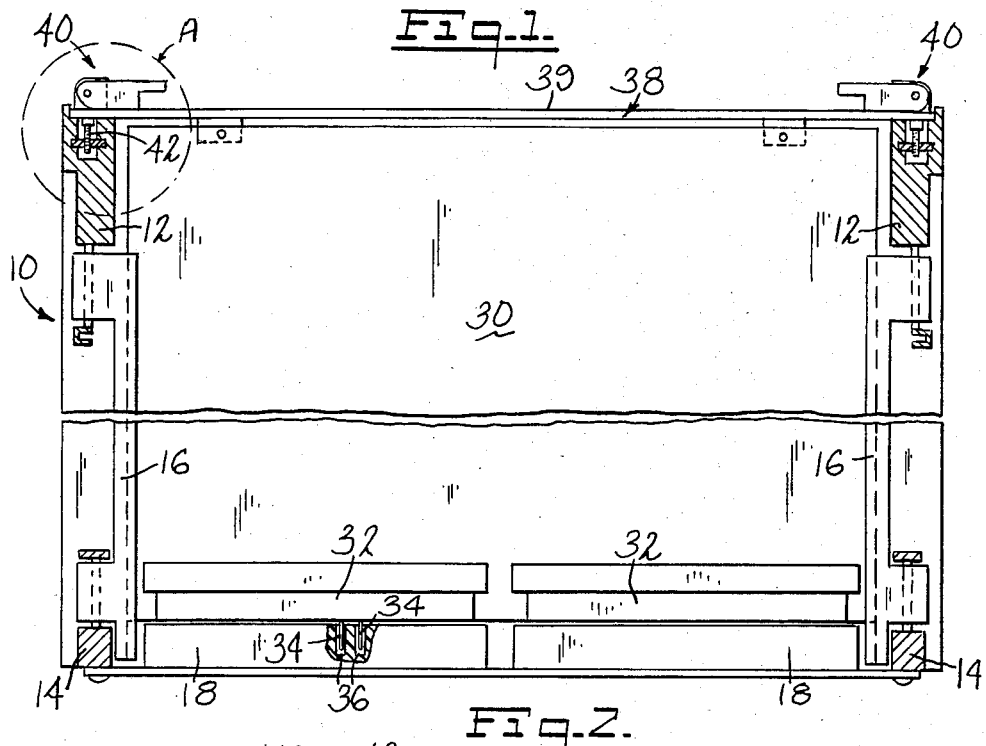
FIG. 1 is a plan view partly in section of a PCB carrying cabinet showing an inserted circuit board having the injector/ejector device of the present invention attached thereto.

FIG. 1 is a plan view of an exemplary card cage or cabinet 10 having parallel upper and lower front frame members 12 and parallel upper and lower rear frame members 14. These members are supported by a pair of parallel end pieces (not shown) and are oriented perpendicular to the plane of an inserted PCB. Suspended between the upper front and rear frame members and the lower front and rear frame members are a number of card guides 16 which form channels which receive a PCB when it is inserted into the cabinet and direct its progress through the interior the cabinet to one or more card sockets 18 located at the rear end thereof. These sockets are positioned between the upper and lower rear frame members, as shown in FIG. 1. When printed circuit board 30, which has attached at its rearmost edge one or more plugs 32 each having a plurality of pins 34, reaches said sockets these pins will fit into matching receiving holes 36 in socket 18 to form electrical connections between the components on the inserted board and the remainder of the circuit.

As shown further in FIG. 1, PCB 30 has along the length of its front edge, face plate 38 which is mounted perpendicular to the plane of board 30. Also as shown at "A" FIG. 1, there is attached to the outer surface 39 of face plate 38 at least one of injector/ejector devices 40 of the present invention. As shown, device 40 is affixed to face plate 38 at an upper and lower edge of PCG 30 in alignment with slots 41 in front frame members 12.

Figure 2:
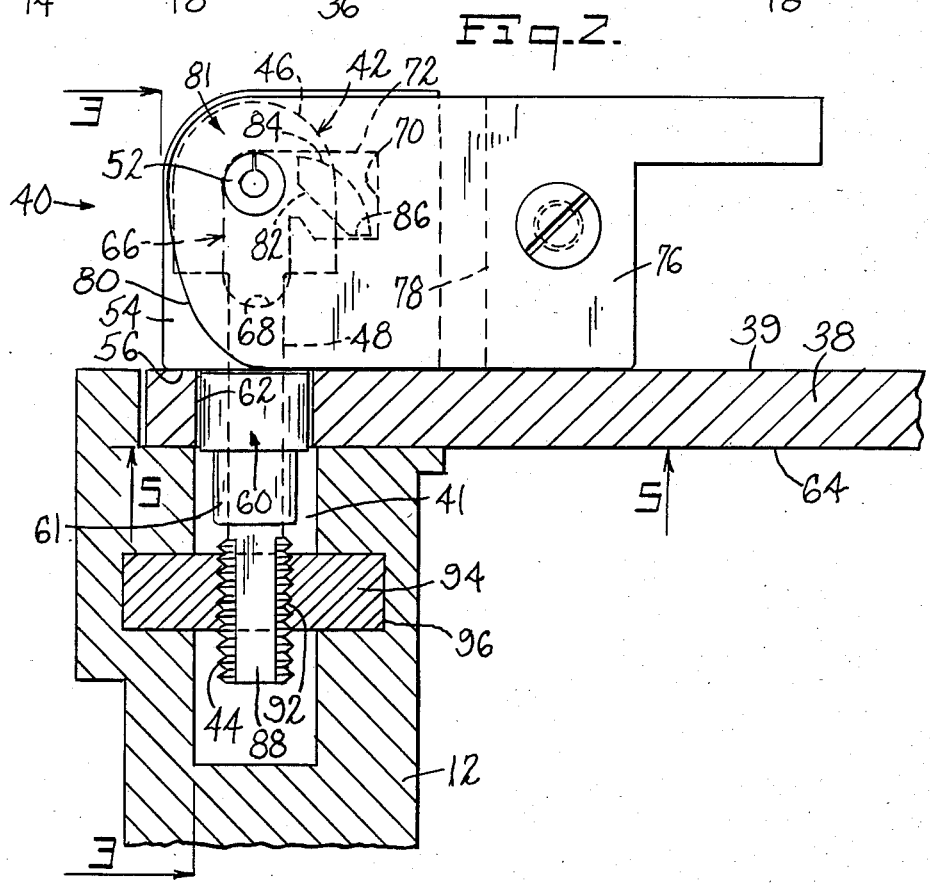
FIG. 2 is an enlarged view of the device identified in "A" of FIG. 1.
Figure 3:
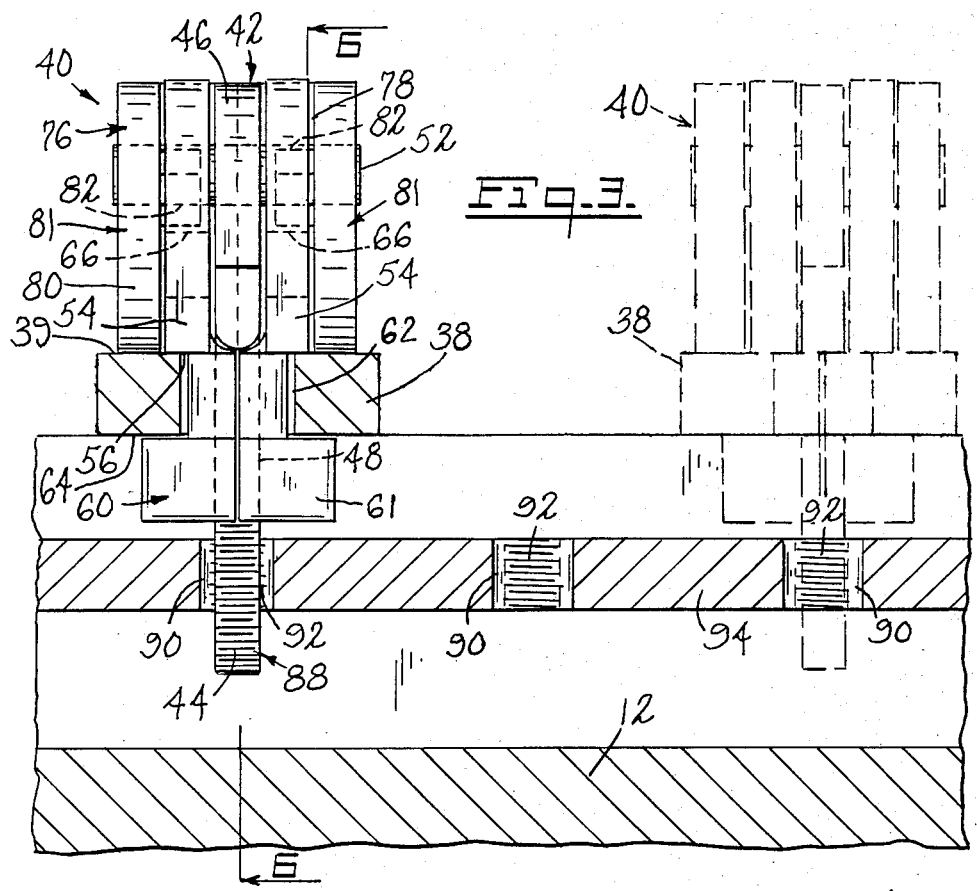
FIG. 3 is an end view of the device shown in FIG. 2.
Figure 5:
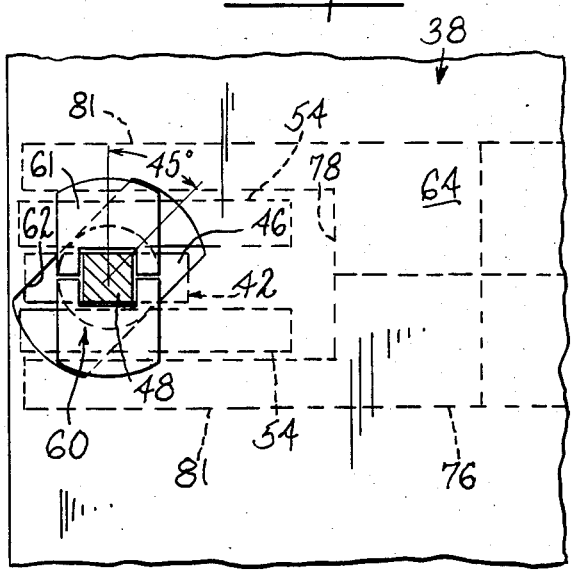
FIG. 5 is a cross sectional view taken along line 5—5 of FIG. 2.
Figure 4:
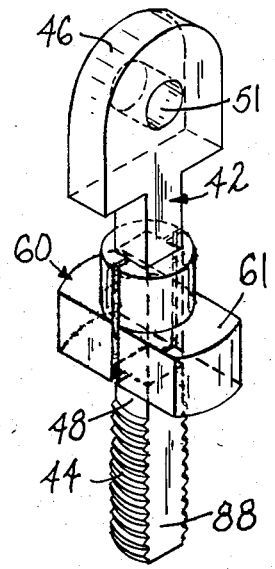
FIG. 4 is a perspective view of the anchor pin shown in FIG. 2.

FIGS. 2 and 3 are enlarged side and end views of portion "A" of FIG. 1 showing the overall structure of injection/ejection device 40 and its installation. In use the device is attached both to face plate 38 and frame member 12 by anchor pin 42. As shown in FIG. 4, anchor pin 42 is essentially flat and key shaped having at its innermost end, engagement means 44 and at outermost head end, 46, a pivot hole 51 said ends being connected by shank 48. As shown in FIG. 5, this is more or less square in cross section. Rigidly attached to and passing through hole 51 is pivot pin 52. When anchor pin 42 is operationally positioned it is in an aspect which is parallel to plane of PCB 30 so that pivot pin 52 will be parallel to frame members 12 and 14 and perpendicular to the plane of PCB 30.

Slidably fitted alongside of anchor pin 42 and mounted onto pivot pin 52 is at least one, preferably a pair, of brackets 54, with at least a portion of the innermost side 56 thereof engaging and firmly bearing against outer side 39 of face plate 38. Bracket 54 further comprises an extension 60 which, as shown in FIG. 5, is configured to encase a lower portion of shank 48, said extension being shaped so that the encased combination will just barely pass through receiving hole 62 in face plate 38. As shown in FIG. 5, receiving hole 62 is more or less rectangular in shape but with rounded ends and with the major axis being rotated approximately 45° relative to the horizontal and vertical axes of face plate 38. When passage of such combination is completed, the unencased upper portion of shank 48 is freely rotatable within hole 62. Further, on such rotation the outermost surface of the encased combination engages the inner side 64 of face plate 38. This engagement, in combination with the aforementioned engagement of bracket inner portion 56 with outer face plate side 39 securly holds the device onto the face plate.

Located within bracket 54, as shown best in FIG. 6, is right angled aperture 66 said aperture having a left portion 68 which is parallel to and aligned with the central axis of anchor pin 42 through which pivot pin 52 fits. Left portion 68 has a sufficient width for bracket 54 to slide freely up and down alongside of shank 48 relative to pivot pin 52, upon the application of a suitably directed linear force. Aperture 66 further contains a second or right portion 70 which is at right angles to left portion 68 and which further has an upper bearing surface 72.

Fitted outside of bracket 54 and anchor pin 42 is lever arm 76, which has a bifurcated construction 78 at one end comprising a pair of arms 81 rotatably connected to the ends of pivot pin 52, said rotation being facilitated by arcuate surface 80. Arms 81 are configured to loosely fit outside of brackets 54 and anchor pin 42. Located on the inner side of at least one of arms 81 is spur 82 which fits into the open interior of right portion 70 of aperture 66. A further shown in FIG. 6, spur 82 is configured so that upon a first, or counter clockwise rotation of lever arm 76 around pivot pin 52, upper spur surface 84 will make an eccentric rolling contact with upper bearing surface 72 so as to exert a linear outwardly directed force thereon.

Further, when lever arm 76 is rotated, in a second or clockwise direction around pivot pin 52 arcuate surface 80 will rotationally bear upon outer face plate surface 39 so as to exert a linear inwardly directed force thereon. It is through the generation of these inwardly and outwardly directed linear forces that the device of the present invention causes quick, positive injection and ejection of the plug on PCB 30 with regard to its receiving socket without the generation of rotational bending forces on the pins therein.

The means by which the device of the present invention causes said pin insertion is as follows. After the device of the present invention is attached to face plate 38 is described hereinabove, the combined structure is inserted into and then pushed through cabinet 10 along guides 16 until plug 32 has made initial contact with socket 18 so that each of plug pins 24 has been partially inserted into its corresponding socket hole 36. At the same time innermost end 88 of anchor pin 42 contacts mounting hole 92. Lever arm 76 is then rotated to stand upright and perpendicular to the plane of face plate 38 to create a linear outwardly directed force. This will cause bracket 54 and clamped face plate 38 of PCB 30 to slide outwardly along the length of anchor pin 42. At the completion of said lever motion, bracket 54 has moved to a point where pivot pin 52 is close to or in contact with the innermost end of left aperture 66. Device 40 is then rotated around the axis of anchor pin 42 until the plane of the device is more or less perpendicular to the lengthwise axis of face plate 38 and parallel to upper crossbar 12. As shown in FIG. 7, such rotation enables the quick and easy attachment of device 40 to crossbar 12 by aligning the flat surfaces of anchor pin 42 at inner end 88 with opposed slots 90 in one of mounting holes 92 so as to slip easily thereinto. In a normal case, a plurality of holes 92 will be spread along the length of frame insert 94, in a spaced relationship with the planes of guides 16. As shown in FIG. 7, locking of device 40 is accomplished by reverse rotating anchor pin 42 90° back to the operational orientation of FIG. 2. When this is done, threaded engagement means 44 reciprocally engages similarly threaded portions of mounting hole 92 thus securely locking the PCB/device assembly into cabinet 10. As shown in FIG. 2, insert 94 itself is enclosed by and tightly contained within the confines of elongated slot 96 of front crossbar 12. It will be appreciated that other types of fastening means may be employed for this purpose without changing the overall functionality of the present invention.

Final injection of the board and seating of pins 34 comprises reverse rotation of still upstanding lever arm 76 around pivot 52 to the position shown in FIG. 2 to generate the aforesaid linear inwardly directed force. In so doing, brackets 54 and clamped face plate 38 of PCB 30 are caused to slide inwardly back along the shank 48 by the eccentric camlike action of arcuate surface 80 as it rotationally bears upon outer side 39 thus exerting said linear mating inward force upon plug 32.

As further shown in FIG. 2 when final injection is completed, bracket extension 60, also closely fits into and is retained within the confines of slot 41 so that after said clockwise lever arm rotation, further rotation of device 40 is prevented and accidental disengagement of device 40 from mounting hole 92 is avoided.

Removal of the board is accomplished merely by reversing the aforesaid actions i.e. reverse rotating lever arm 76 to generate the aforesaid outwardly directed force so that the pins of plug 32 are demated from socket 18 and then rotating device 40 90° to reciprocally disengage anchor pin 42 from mounting hole 92. When said demating and disengagement are completed, the circuit board is loose enough for it to be easily pulled back along guides 16 and removed from cage 10.

It will thus be seen that the objects and advantages set forth above, among those made apparent from the preceding description, are efficiently attained and, since certain changes may be made in the above article without departing from the spirit and scope of the invention, it is intended that all matter contained in the above description and shown in the accompanying drawings shall be interpreted as illustrative and not in a limiting sense.

I claim:

1. An injection/ejection device to aid in the entry and removal of an object from a mating apparatus, said device comprising:
   a lever with a bifurcated portion, said portion, being rotatably attached to the ends of a pivot pin;
   bracket means slidably mounted onto said pivot pin within said bifurcated portion and further comprising means for rotatably mounting the device onto the object;
   anchor means fixedly attached within said bifurcated portion to said pivot pin and further having engagement means to attach the object to the apparatus at an opposite end;
   first means for generating an outwardly directed linear force within said object; and
   second means for generating an inwardly directed linear force within the object, whereby the object may be injected into and ejected from the apparatus.

2. The device of claim 1 wherein said bifurcated portion comprises a pair of arms each mounted to an end of said pivot pin and having an eccentric arcuate surface at an inner corner adapted to bear upon object, at least one of said arms having a spur on its inner side;

3. The device of claim 2 wherein said bracket means further comprises an aperture having a first elongated portion oriented parallel to said anchor means through which said pivot pin passes and an enlarged second portion having an upper bearing surface, said second portion being positioned to receive said spur.

4. The device of claim 3 wherein said first force generating means comprises having said spur oriented within said second aperture portion such that a first rotation of said lever arm will cause an upper surface of said spur to eccentrically contact an upper one of said aperture bearing surfaces and generate said outwardly directed linear force whereby the object is ejected from the apparatus.

5. The device of claim 4 wherein said second force generating means comprises a placement of said arcuate surface such that upon a second rotation of said lever opposite to said first rotation, said arcuate surface will eccentrically contact and bear upon the object to generate said inwardly directed linear force whereby the object is injected into the apparatus.

6. The device of claim 1 wherein the object is a printed circuit board and the apparatus is a card cage.

7. The device of claim 6 wherein the printed circuit board has a face plate mounted to an outer edge thereof.

8. The combination of an object and an injection/ejection device for aiding the entry of the object into a mating apparatus for securing the object in the mating apparatus and for aiding the removal of the object from the mating apparatus, said combination comprising a printed circuit board (PCB), having a face plate mounted to an outer edge thereof and at least one injection/ejection device rotatably mounted onto the face plate in a position and oriented such that it can be attached to the mating when the printed circuit board is inserted into the mating apparatus; said device comprising:
   a pivot pin;
   lever arm having a bifurcated portion at one end, said bifurcated portion being rotatably mounted about said pivot pin and having at least one spur on an innermost surface thereof and further having an arcuate surface adapted to bear upon the face plate;

an anchor pin fixedly mounted to said pivot pin within said bifurcated portion said anchor pin further comprising an inner end connected to said outer edge by a shank, said inner end having engagement means for mounting said device onto the apparatus;

two brackets each having an aperture therein and slidably mounted onto said pivot pin within said bifurcated portion, one on either side of said anchor pin, said aperture having an elongated first portion substantially parallel to the axis of said anchor pin through which said pivot pin passes, and a second portion having an upper bearing surface, said second portion being positioned to receive said spur;

rotatable means for holding said device onto the face plate;

first means for generating an outwardly directed linear force within the PCB; and second means for generating an inwardly directed linear force within the PCB, whereby the PCB may be injected into and ejected from the apparatus.

9. The combination of claim 8 wherein said first force generating means comprises having said spur oriented within said second aperture portion such that a first rotation of said lever arm will cause an upper surface of said spur to eccentrically contact said upper bearing surface and generate said outwardly directed linear force whereby the PCB is ejected from the mating apparatus;

10. The combination of claim 8 wherein said second force generating means comprising a placement of said arcuate surface such that upon a second rotation of said lever opposite to said first rotation, said arcuate surface will eccentrically contact the face plate and generate said inwardly directed linear force whereby the PCB is injected into the mating apparatus.

11. The combination of a printed circuit board (PCB) and an insertion/ejection device, the PCB having at least one plug mounted on its rearmost edge, the plug having a plurality of electrical connection pins thereon, said device aiding in the mating entry of the pins of the plug into matching holes in a socket located in a receiving card cage and the subsequent demating of the plug pins from the socket holes for the removal of the PCB, the combination comprising a printed circuit board having a face plate mounted to an outer edge thereof and at least one injection/ejection device rotatably mounted onto the face plate in a position and orientation such that it can be attached to the receiving card cage when the printed circuit board is inserted into the receiving card cage; said device comprising:

a pivot pin;

a lever arm having a bifurcated portion at one end, said bifurcated portion being rotatably mounted about said pivot pin and further having at least one spur on an innermost surface thereof and an arcuate surface adapted to bear eccentrically upon the face plate;

an anchor pin fixedly mounted to said pivot pin within said bifurcated portions said anchor pin further comprising an inner end connected to said outer edge by a shank, said inner end having engagement means for mounting the PCB into the receiving card cage;

two brackets, each having an aperture therein, which are slidably mounted onto said pivot pin within said bifurcated portion, one on each side of said anchor pin, said aperture having an elongated first portion substantially parallel to the axis of said anchor pin through which said pivot pin passes, and a second portion having an upper surface. Said second portion being positioned to receive said spur;

rotatable means for holding said device onto the face plate;

first means for generating an outwardly directed linear force within said PCB; and second means for generating an inwardly directed linear force within said PCB, wherein said first force generating means comprises having said spur oriented within said second aperture portion such that a first rotation of said lever arm will cause and upper surface of said spur to contact said upper bearing surface and generate said outwardly directed linear force, and wherein said second force generation means is a placement of said arcuate surface in an aspect such that a second rotation of said lever arm opposite to said first rotation will cause said surface to eccentrically contact the face plate and generate said outwardly directed linear force, whereby the PCB is injected into and ejected from the receiving card cage.

12. An injection/ejection device to aid in the entry and removal of an object from a mating apparatus, said device comprising:

a lever with a bifurcated portion, said portion being rotatably attached to the ends of a pivot pin;

two brackets means slidably mounted onto said pivot pin within said bifurcated portion and further comprising means for rotatably mounting the device onto the object;

anchor means fixedly attached within said bifurcated portion to said pivot pin and further having engagement means to attach the object to the mating apparatus at an opposite end;

first means for generating an outwardly directed linear force within said object; and second means for generating an inwardly directed linear force within the object, whereby the object may be injected into and ejected from the mating apparatus.

13. A method of injecting a printed circuit board (PCB) having a face plate on a front edge and a plug on a rear edge thereof into a receiving card cage having a socket which matably engages said plug comprising:

A. providing an injection/ejection device to aid in the entry and removal of said PCB from said receiving card cage said device comprising a lever with a bifurcated portion, said bifurcated portion comprising a pair of arms each mounted to an end of a pivot pin and having an eccentric arcuate surface at an inner corner adapted to bear upon said PCB, at least one of said arms having a spur on its inner side, said bifurcated portion being rotatably attached to the ends of said pivot pin;

a bracket means comprising an aperture having a first elongated portion oriented parallel to an anchor means through which said pivot pin passes and an enlarged second portion having an upper bearing surface, said second portion being positioned to receive said spur;

said bracket means slidably mounted onto said pivot pin within said bifurcated portion and further comprising a means for rotatably mounting the device onto the PCB;

said anchor means fixedly attached within said bifurcated portion to said pivot pin and further having engagement means to attach the PCB to the receiving card cage at an opposite end;

a first means for generating an outwardly directed linear force within said PCB, said first force generating means comprises having said spur oriented within said second aperture portion such that a first rotation of said lever arm will cause an upper surface of said spur to contact eccentrically an upper one of said aperture bearing surfaces and generate said outwardly directed linear force whereby the PCB is ejected from the receiving card cage;

a second means for generating an inwardly directed linear force within the PCB wherein said second force generating means comprises a placement of said arcuate surface such that upon a second rotation of said lever arm opposite to said first rotation, said arcuate surface will eccentrically contact and bear upon the PCB to generate said inwardly directed linear force whereby the PCB is injected into the receiving card cage;

B. rotatably mounting said device onto the face plate;
C. inserting the PCB into the receiving card cage until the plug contacts the socket;
D. rotating said lever arm so as to generate an outwardly directed linear force causing said bracket and face plate to move outward relative to said anchor means;
E. rotating said device around said anchor means until said engagement means slips into and reciprocally engages a mounting hole in a front frame member of the receiving card cage; and
F. reverse rotating said lever arm so as to generate an inwardly directed linear force causing the PCB to move inward and cause the plug to mate with said socket.

14. The method of claim 13 further comprising the steps of:
G. rotating said lever arm so as to generate an outwardly directed linear force so as to demate the plug from the socket;
H. rotating said device within the mounting hole until it is reciprocally disengaged therefrom; and
I. removing the PCB from the receiving card cage.

* * * * *

UNITED STATES PATENT AND TRADEMARK OFFICE
CERTIFICATE OF CORRECTION

PATENT NO. : 4,638,405
DATED : Jan. 20, 1987
INVENTOR(S) : Kenneth R. Smith

It is certified that error appears in the above-identified patent and that said Letters Patent are hereby corrected as shown below:

Column 1, line 33, "to" should be --or--.

Column 3, line 62, "PCG" should be --PCB--.

Column 5, line 2, "is", first occurrence should be -- as --.

Column 7, line 35, "comprising" should be --comprises--.

Column 8, line 19, "and" should be --an--.

Signed and Sealed this

Twenty-eighth Day of April, 1987

Attest:

DONALD J. QUIGG

*Attesting Officer*

*Commissioner of Patents and Trademarks*